(12) United States Patent
Wang et al.

(10) Patent No.: US 8,744,631 B2
(45) Date of Patent: Jun. 3, 2014

(54) MANIPULATING ENVIRONMENTAL CONDITIONS IN AN INFRASTRUCTURE

(75) Inventors: Zhikui Wang, Fremont, CA (US);
Cullen E. Bash, Los Gatos, CA (US);
Alan A. McReynolds, Los Altos, CA (US); Christopher Edward Hoover, Campbell, CA (US); Chih C. Shih, San Jose, CA (US); Carlos J. Felix, Isabela, PR (US); Rongliang Zhou, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 461 days.

(21) Appl. No.: 13/016,278

(22) Filed: Jan. 28, 2011

(65) Prior Publication Data

US 2012/0197444 A1    Aug. 2, 2012

(51) Int. Cl.
*G06F 19/00* (2011.01)
*F24F 11/00* (2006.01)
*G06F 1/20* (2006.01)
*F24F 11/053* (2006.01)
*F24F 13/08* (2006.01)

(52) U.S. Cl.
CPC ........... *F24F 11/0012* (2013.01); *F24F 11/053* (2013.01); *F24F 13/08* (2013.01); *G06F 1/20* (2013.01); *G06F 1/206* (2013.01)
USPC ............................................ 700/276; 165/67

(58) Field of Classification Search
CPC ..................... F24F 2011/0067; F24F 11/0012; F24F 11/053; F24F 13/08; G06F 1/20; G06F 1/206
USPC ............................................ 700/276; 165/67
See application file for complete search history.

(56) References Cited

U.S. PATENT DOCUMENTS

| | | |
|---|---|---|
| 3,788,386 A | 1/1974 | Demaray |
| 4,188,862 A | 2/1980 | Douglas, III |
| 4,497,031 A | 1/1985 | Froehling et al. |
| 4,646,964 A | 3/1987 | Parker et al. |
| 4,672,206 A | 6/1987 | Suzuki et al. |

(Continued)

FOREIGN PATENT DOCUMENTS

| | | |
|---|---|---|
| DE | 19927265 | 12/1999 |
| WO | WO-2005057065 | 6/2005 |
| WO | WO-2005088204 | 9/2005 |
| WO | WO-2008156741 A2 | 12/2008 |

OTHER PUBLICATIONS

Awtrey, D~"Transmitting Data and Power Over a One-Wire Bus"~Sensors, The Journal of Applied Sensing Technology~Feb. 1997~4 pages.

(Continued)

*Primary Examiner* — Michael D Masinick

(57) ABSTRACT

A system and method for manipulating environmental conditions in an infrastructure containing a fluid moving device are disclosed that include identifying correlations between operational settings of the fluid moving device and environmental conditions resulting from changes to the operational settings. In addition, an environmental condition detected at a location proximate to or within the plenum following supply of fluid into the plenum by the fluid moving device is received and errors between the received environmental condition and a reference environmental condition are identified. Operational settings for the fluid moving device to achieve the reference environmental condition are determined based upon the identified correlations and errors.

17 Claims, 9 Drawing Sheets

(56) References Cited

U.S. PATENT DOCUMENTS

| | | |
|---|---|---|
| 5,145,456 A | 9/1992 | Ito et al. |
| 5,180,331 A | 1/1993 | Daw et al. |
| 5,417,077 A | 5/1995 | Jeffery et al. |
| 5,461,875 A | 10/1995 | Lee et al. |
| 5,493,194 A | 2/1996 | Damiano et al. |
| 5,623,259 A | 4/1997 | Giangardella |
| 5,673,851 A | 10/1997 | Dozier et al. |
| 5,733,188 A | 3/1998 | Jacob |
| 5,810,245 A | 9/1998 | Heitman et al. |
| 5,826,654 A | 10/1998 | Adnan et al. |
| 5,944,098 A | 8/1999 | Jackson |
| 6,010,113 A | 1/2000 | Rotering |
| 6,055,144 A | 4/2000 | Reid |
| 6,070,114 A | 5/2000 | Fendt et al. |
| 6,095,867 A | 8/2000 | Brandt et al. |
| 6,349,883 B1 | 2/2002 | Simmons et al. |
| 6,374,627 B1 | 4/2002 | Schumacher et al. |
| 6,465,908 B1 | 10/2002 | Karuppana et al. |
| 6,574,104 B2 | 6/2003 | Patel et al. |
| 6,581,847 B2 | 6/2003 | Kline et al. |
| 6,659,359 B2 | 12/2003 | Kwak |
| 6,675,302 B2 | 1/2004 | Ykema |
| 6,712,335 B1 | 3/2004 | Naughton |
| 6,868,682 B2 | 3/2005 | Sharma et al. |
| 6,881,142 B1 | 4/2005 | Nair |
| 6,882,125 B2 | 4/2005 | Kameda et al. |
| 6,925,828 B1 | 8/2005 | Gerstner et al. |
| 6,945,058 B2 | 9/2005 | Bash et al. |
| 6,971,631 B1 | 12/2005 | Naughton |
| 6,981,915 B2 | 1/2006 | Moore et al. |
| 6,995,658 B2 | 2/2006 | Tustison et al. |
| 7,000,480 B2 | 2/2006 | Kramer |
| 7,006,949 B2 | 2/2006 | Moore |
| 7,013,968 B2 | 3/2006 | Beitelmal et al. |
| 7,031,154 B2 | 4/2006 | Bash et al. |
| 7,086,603 B2 | 8/2006 | Bash et al. |
| 7,155,318 B2 | 12/2006 | Sharma et al. |
| 7,171,328 B1 | 1/2007 | Walker et al. |
| 7,194,337 B2 | 3/2007 | Sharma et al. |
| 7,197,433 B2 | 3/2007 | Patel et al. |
| 7,251,547 B2 | 7/2007 | Bash et al. |
| 7,272,945 B2 | 9/2007 | Bash et al. |
| 7,313,461 B2 | 12/2007 | Sharma et al. |
| 7,313,924 B2 | 1/2008 | Bash et al. |
| 7,320,638 B2 | 1/2008 | Craig |
| 7,347,058 B2 | 3/2008 | Malone et al. |
| 7,373,268 B1 | 5/2008 | Viredaz et al. |
| 7,447,920 B2 | 11/2008 | Sharma et al. |
| 7,463,950 B1 | 12/2008 | Brey et al. |
| 7,475,558 B2 | 1/2009 | Perry |
| 7,477,028 B2 | 1/2009 | Bokusky et al. |
| 7,534,167 B2 | 5/2009 | Day |
| 7,584,021 B2 | 9/2009 | Bash et al. |
| 7,630,795 B2 | 12/2009 | Campbell et al. |
| 7,640,760 B2 | 1/2010 | Bash et al. |
| 7,669,431 B2 | 3/2010 | Bash et al. |
| 7,739,073 B2 | 6/2010 | Hamann et al. |
| 7,856,495 B2 | 12/2010 | Chainer et al. |
| RE42,195 E | 3/2011 | Bash et al. |
| 7,902,966 B1 | 3/2011 | Beitelmal et al. |
| 7,995,339 B2 | 8/2011 | Bash et al. |
| 8,019,477 B2 * | 9/2011 | Bash et al. ............. 700/276 |
| 8,180,494 B2 | 5/2012 | Dawson et al. |
| 8,255,709 B2 | 8/2012 | McCarthy et al. |
| 8,352,085 B2 | 1/2013 | Marwah et al. |
| 8,355,828 B2 | 1/2013 | Tolia et al. |
| 8,390,454 B2 | 3/2013 | Lyon et al. |
| 8,639,651 B2 | 1/2014 | Beitelmal |
| 2001/0042792 A1 | 11/2001 | Kline et al. |
| 2004/0176022 A1 | 9/2004 | Thrasher et al. |
| 2005/0023363 A1 | 2/2005 | Sharma et al. |
| 2005/0138440 A1 | 6/2005 | Barr et al. |
| 2005/0182523 A1 | 8/2005 | Nair |
| 2005/0208888 A1 | 9/2005 | Moore et al. |
| 2005/0266792 A1 | 12/2005 | Rimmer et al. |
| 2005/0278070 A1 * | 12/2005 | Bash et al. ............. 700/276 |
| 2005/0278071 A1 | 12/2005 | Durham, III |
| 2006/0075764 A1 | 4/2006 | Bash et al. |
| 2006/0086119 A1 | 4/2006 | Malone et al. |
| 2006/0091229 A1 * | 5/2006 | Bash et al. ............. 236/49.3 |
| 2006/0242908 A1 | 11/2006 | McKinney |
| 2007/0062685 A1 * | 3/2007 | Patel et al. ............. 165/247 |
| 2007/0078635 A1 | 4/2007 | Rasmussen et al. |
| 2007/0125107 A1 | 6/2007 | Beam |
| 2007/0167086 A1 | 7/2007 | Tolli |
| 2007/0190927 A1 | 8/2007 | Bash et al. |
| 2007/0235440 A1 | 10/2007 | Gu et al. |
| 2008/0009237 A1 | 1/2008 | Wu |
| 2008/0119127 A1 | 5/2008 | Stewart |
| 2008/0244104 A1 | 10/2008 | Clemente |
| 2008/0277486 A1 | 11/2008 | Seem et al. |
| 2009/0134333 A1 | 5/2009 | Ishibashi et al. |
| 2009/0138313 A1 | 5/2009 | Morgan et al. |
| 2009/0173473 A1 * | 7/2009 | Day ............. 165/67 |
| 2009/0187284 A1 | 7/2009 | Kreiss et al. |
| 2009/0293518 A1 | 12/2009 | Bettella |
| 2010/0029193 A1 | 2/2010 | Ahladas et al. |
| 2010/0057259 A1 | 3/2010 | Dawson et al. |
| 2010/0076607 A1 | 3/2010 | Ahmed et al. |
| 2010/0105311 A1 | 4/2010 | Meneely, Jr. |
| 2010/0311317 A1 | 12/2010 | McReynolds et al. |
| 2012/0078422 A1 | 3/2012 | Mejias et al. |

OTHER PUBLICATIONS

Bash at al;Dynamic Thermal Management of Air Cooled Data Centers;HP Labs~HPL-2006-11~Jan. 2006~9 pages.

Beitelmal et al;Local Cooling Control of Data Centers with Adaptive Vent Tiles;Proc of IPACK 2009~ASME InterPack 09—Jul. 2008~8 pages.

Boucher et al; Viability of Dynamic Cooling Control in a Data Center Environment;UC Berkeley—Jan. 2006~pp. 25.

Computer Dictionary definition of "module"~Microsoft Press~1997 page 313 (3 pages total).

* cited by examiner

MANIPULATING ENVIRONMENTAL CONDITIONS IN AN INFRASTRUCTURE

CROSS REFERENCE TO RELATED APPLICATIONS

The present application contains similar subject matter and refers to commonly assigned and copending U.S. patent application Ser. No. 10/976,786, filed on Nov. 1, 2004, by Cullen E. Bash et al., and entitled "Control of Vent Tiles Correlated with a Rack", U.S. patent application Ser. No. 10/960,573, filed on Oct. 8, 2004, by Cullen E. Bash et al., and entitled "Correlation of Vent Tiles and Racks", U.S. patent application Ser. No. 11/353,557, filed on Feb. 14, 2006, by Cullen E. Bash et al., and entitled "Ventilation Tile with Collapsible Damper"; U.S. patent application Ser. No. 11/764,410, filed on Jun. 18, 2007, by Abdlmonem H. Beitelmal et al., and entitled, "Microcontroller for Controlling an Actuator"; U.S. patent application Ser. No. 12/480,429, filed on Jun. 8, 2009, by Alan A. McReynolds et al., and entitled "Vent Tile with an Integrated Thermal Imaging Sensor and Controller", and U.S. patent application Ser. No. 12/609,937, filed on Oct. 30, 2009, by Abdlmonem Beitelmal et al. and entitled "Manipulating Environmental Conditions In An Infrastructure". The disclosures of which are hereby incorporated by reference in their entireties.

BACKGROUND

In data centers with raised floor architectures, vent tiles are typically distributed over the raised floor and locally distribute airflow from a plenum formed below the raised floor. The plenum is pressurized with cold air by blowers in one or more computer room air conditioning (CRAC) units. The vent tiles allow cold air to escape from the plenum and to travel from the raised floor to the intakes of rack-mounted equipment. The most common vent tile has a fixed 25% opening, however, vent tiles with larger fixed openings are available in standard sizes of 47%, 56% and 85%. In addition, it is common to install the vent tiles in front of each rack containing equipment. Consequently, the airflow provided to the equipment is relatively constant, as the tile configuration and blower speed are fixed and rarely changed.

However, the environment of a data center is dynamic because workload placement and power dissipation fluctuate considerably over time and space. To compensate for these fluctuations, zonal controllers are typically employed to control the CRAC temperature set points and/or blower speeds in real time, and maintain the return air temperatures to the CRAC units below certain thresholds, or the highest intake temperatures of racks in thermal zones below their thresholds. Nevertheless, the zonal controllers are designed to respond to return air temperatures or the hot spots in thermal zones that can be affected by the CRAC units. As such, the temperature distribution inside the thermal zones is still non-uniform, which often results in overprovisioning of cooling capacity and is thus inefficient.

BRIEF DESCRIPTION OF THE DRAWINGS

Features of the present disclosure are illustrated by way of example and not limited in the following figure(s), in which like numerals indicate like elements, in which.

DETAILED DESCRIPTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the term "includes" means includes but not limited to, the term "including" means including but not limited to. The term "based on" means based at least in part on.

Disclosed herein are a method and a controller for manipulating environmental conditions in an infrastructure containing a fluid moving device. The controller is to implement a model that identifies correlations between a volume flow rate of the fluid moving device and the conditions detected within the infrastructure. The controller is also to determine operational settings of the fluid moving device through evaluation of the correlations and a feedback loop that evaluates errors between detected environmental conditions and reference (or desired) environmental conditions.

Through implementation of the method and controller disclosed herein, local and zonal cooling control actuators may be manipulated to substantially optimize cooling distribution in an infrastructure. More particularly, for instance, the local and zonal cooling control actuators may be manipulated to substantially minimize cooling resource use in the infrastructure while meeting predefined environmental condition thresholds.

Figure 1:
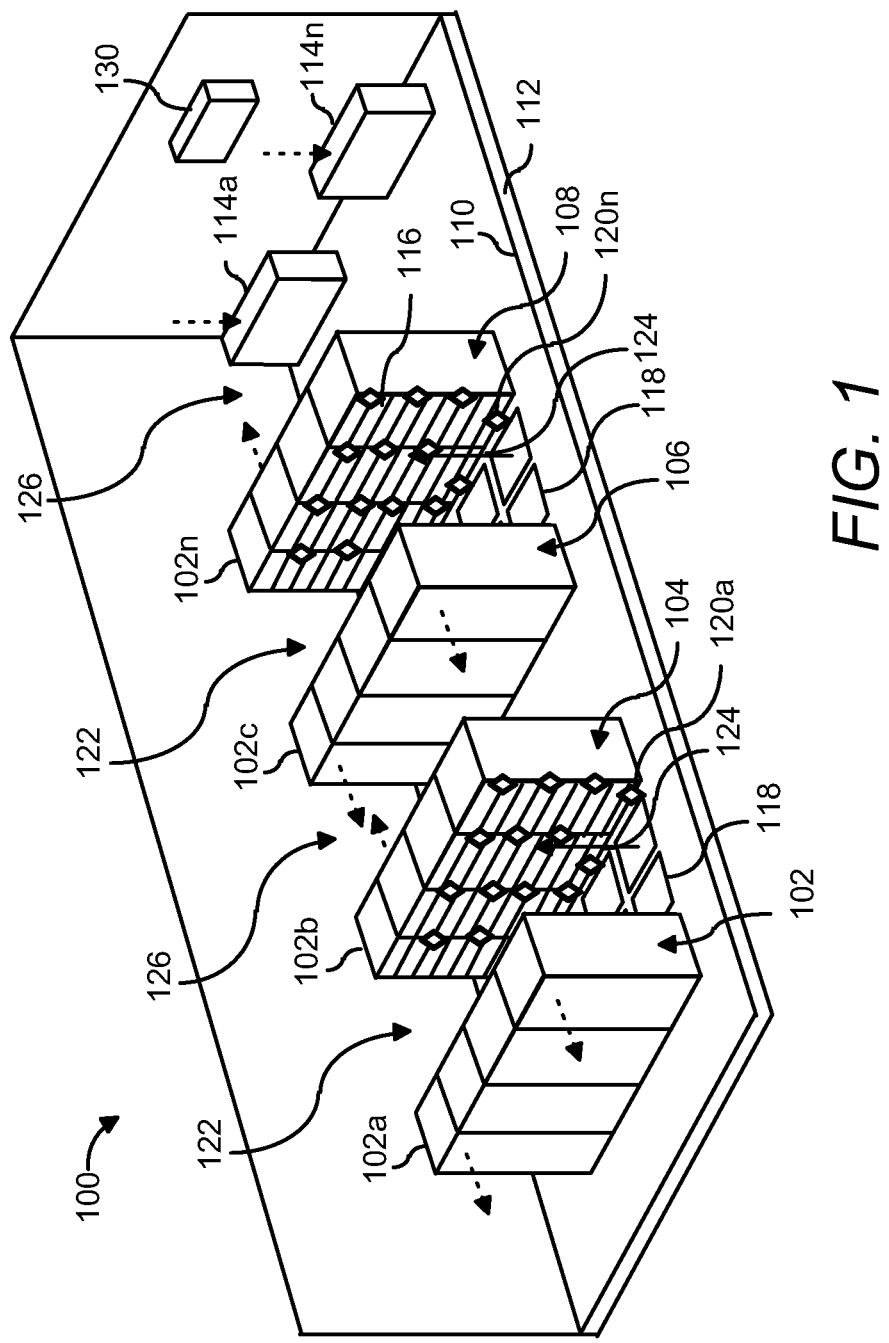
FIG. 1 shows a simplified perspective view of a section of an infrastructure, in this instance, a data center, in which a method and controller for controlling a fluid moving device and adaptive vent tiles may be implemented, according to an example of the present disclosure.

With reference first to FIG. 1, there is shown a simplified perspective view of a section of an infrastructure 100, in this instance, a data center, in which a method and controller for controlling a fluid moving device (FMD) may be implemented, according to an example. It should be understood that the infrastructure 100 may include additional elements and that some of the elements described herein may be removed and/or modified without departing from a scope of the infrastructure 100. For instance, although particular reference is made to the infrastructure comprising a data center, it should be understood that the examples of the present disclosure may be practiced in any suitable infrastructure, such as, an office building, a home, or other structure.

The infrastructure 100 is depicted as having a plurality of racks 102a-102n, a plenum 112, a plurality of FMDs 114a-114m, a plurality of electronic components 116, a plurality of vent tiles 118, and a plurality of sensors 120a-120n. The vent tiles 114a-114m may comprise adaptive vent tiles (AVTs). Although not shown, some of the sensors 120a-120n may be positioned at various locations within the plenum 112 to detect environmental conditions within the plenum 112. As discussed in greater detail herein below, the environmental condition information collected by the sensors 120a-120n may be used to identify correlations between operational settings of the FMDs 114a-114m and environmental conditions at locations proximate to or within the plenum 112. The operational settings include a volume flow rate and a supply temperature of fluid supplied by the FMDs 114a-114m. Additionally, as discussed in greater detail herein below, environmental condition information collected by the sensors 120a-120n may be used to identify correlations between operational settings of the AVTs 118 and the environmental conditions detected at or in the electronic components 116.

In order to effectuate the remote manipulation, actuators (not shown) may be provided to vary the operational settings of one or more of the AVTs 118. In addition, each of the AVTs 118 may also include an interface through which the AVTs 118 may receive instruction signals from a controller 130. The operational settings of the AVTs 118 may include the opening levels of the AVTs 118 that may be used to vary the fluid flow and, in some instances, a speed level of local fans used to vary the flow rate of fluid through the AVTs 118. Although the AVTs 118 may have many different suitable configurations without departing from a scope of the present disclosure, examples of suitable AVTs 118 may be found in commonly assigned and copending U.S. patent application Ser. Nos. 11/353,557, 11/764,410, and 12/480,429, which have been introduced above. As discussed in each of these applications for patent, the operational settings of the vent tiles are remotely and automatically controllable.

According to another example, however, the correlations may be identified through implementation of a suitable computational fluid dynamics tool. In any regard, the operational settings of the FMDs 114a-114m, such as but not limited to the volume flow rate of fluid and the supply temperature of fluid supplied by the FMDs 114a-114m. In addition, the operational settings of the AVTs 118 may also be modified based upon additional correlations. More particularly, the operational settings of the FMDs 114a-114m, and/or the operational settings of the AVTs 118 may be modified based upon an error level between detected environmental conditions and predefined environmental conditions and the identified correlations.

The racks 102a-102n are positioned on a raised floor 110 and house electronic devices 116 capable of generating/dissipating heat, for instance, computers, servers, bladed servers, disk drives, displays, etc. As shown by the arrows 124 in FIG. 1, fluid, such as, cool airflow, may be delivered to zones of the infrastructure 100 using the FMDs 114a-114m. Some or all of the FMDs 114a-114m may comprise computer room air conditioners (CRACs), computer room air handlers (CRAHs) and chillers.

Zonal actuators (shown in FIG. 2) may be provided to vary the operational settings of the FMDs 114a-114m, such as but not limited to the volume flow rate and the supply temperature of fluid supplied by the FMDs 114a-114m. The fluid contained in the plenum 112 may include fluid supplied by multiple ones of the FMDs 114a-114m. Each of the FMDs 114a-114m may also include an interface through which the FMDs 114a-114m may receive instruction signals from a controller 130. As described in detail hereinbelow, the characteristics of the fluid, such as, temperature, pressure, humidity, flow rate, etc., delivered to various locations in the infrastructure 100 may substantially be affected by the operations of a plurality of the FMDs 114a-114m. For instance, each of the plurality of FMDs 114a-114m may provide fluid having varying supply temperature and volume flow rate to locations of the plenum 112. More particularly, similar variations in fluid provided by particular FMDs 114a-114m may result in different environmental condition change for particular locations of the plenum 112. As such, and as discussed in greater detail herein below, correlations between the operational settings of the FMDs 114a-114m and the environmental conditions detected by one or more of the sensors 120a-120n are identified to determine how varying the operational settings of the FMDs 114a-114m are determined to affect the conditions detected by the sensors 120a-120n.

As shown in FIG. 1, the fluid supplied into the plenum 122 by the FMDs 114a-114m may be delivered through vent tiles 118 in the floor 110 to the electronic components 116 housed in the racks 102a-102n. Some or all of the vent tiles 118 may comprise AVTs 118. The vent tiles 118 that are not AVTs may comprise vent tiles having fixed openings. The AVTs 118 are generally opened and closed over a relatively wide range of operational settings to thus vary the flow rate of fluid supplied from beneath the raised floor 110. In addition, the AVTs 118 may be remotely opened and closed.

In this example, in addition to the zonal actuators provided in the FMDs 114a-114m to vary the volume flow rate and/or temperature of the fluid supplied by the FMDs 114a-114m described hereinabove, local cooling actuators (shown in FIG. 2) may be provided to vary the operational settings of one or more of the AVTs 118. As described in detail hereinbelow, control of tuning of the local cooling actuators and the zonal actuators may be coordinated. In this regard, varying the operational settings of one of the AVTs 118 and a particular of the FMDs 114a-114m may result in a different environmental condition at an electronic component 116 as compared with varying the operational settings of another one of the AVTs 118 and another of the FMDs 114a-114m positioned at a different location in the infrastructure 100. Each of the AVTs 118 may also include an interface through which the AVTs 118 may receive instruction signals from the controller 130. The operational settings of the AVTs 118 are remotely and automatically controllable. In other words, varying the operational settings of different AVTs 118 and varying the operational settings of different FMDs 114a-114m may not result in the same environmental condition change. As such, and as discussed in greater detail herein below, correlations between various operational settings of the FMDs 114a-114m and the operational settings of one or more AVTs 118 and the environmental conditions detected by one or more of the sensors 120a-120n resulting from the various changes are identified to determine how the various changes are determined to affect the conditions detected by the sensor(s) 120a-120n.

The sensors 120a-120n may be networked with a controller 130 and may convey detected environmental condition information through any suitable wired or wireless means to the controller 130. The detected environmental conditions may include, for instance, temperature, pressure, fluid flow volume, humidity, etc. As described below, the controller 130 may employ the environmental condition information to identify correlations between operational settings of the FMDs 114a-114m and environmental conditions resulting from changes to the operational settings of the FMDs 114a-114m. Additionally, the controller 130 may employ the environmental condition information received from the sensors 120a-120n to identify correlations between the operational settings of the FMDs 114a-114m, the operational settings of the AVTs 118, and environmental conditions resulting from changes to the operational settings of the FMDs 114a-114m. The controller 130 is also to identify errors between the detected environmental conditions and reference (or desired) environmental conditions, which may, for instance, be based upon desired or required operating conditions of the electronic components 118. The controller 130 is further to determine operational settings of the FMDs 114a-114m, and in additional examples operational settings for one or more of the AVTs 118, based upon the identified correlations and errors. Moreover, the controller 130 is to communicate instructions to the FMDs 114a-114m to manipulate their respective zonal actuators to cause the FMDs 114a-114m to have determined operational settings. In additional examples, the controller 130 is to communicate instructions to the AVTs 118 to manipulate their respective local actuators to cause the AVTs 118 to have the determined operational settings.

Figure 4:
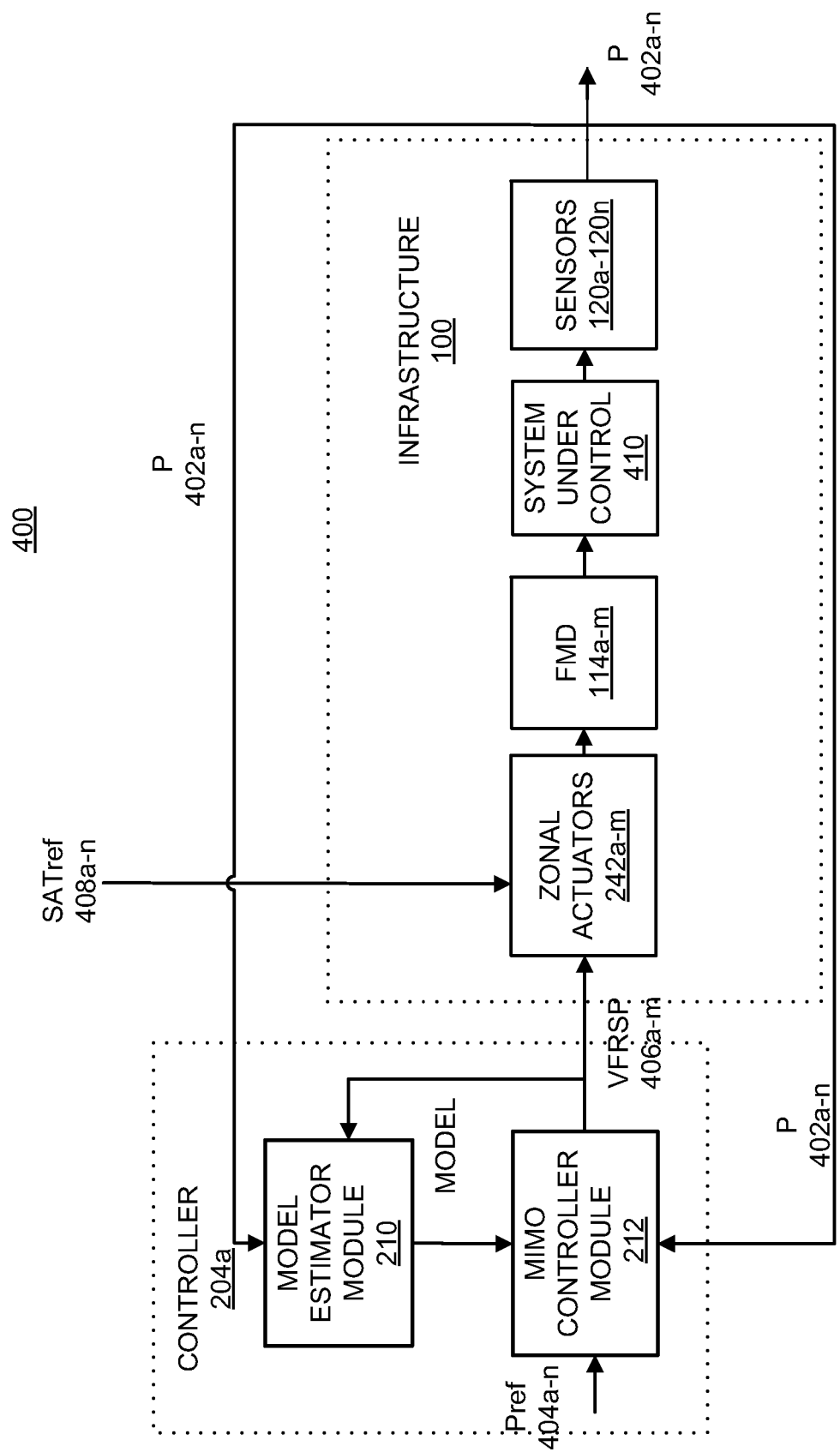
FIG. 4 depicts a control diagram of a controller, according to an example of the present disclosure.
Figure 6:
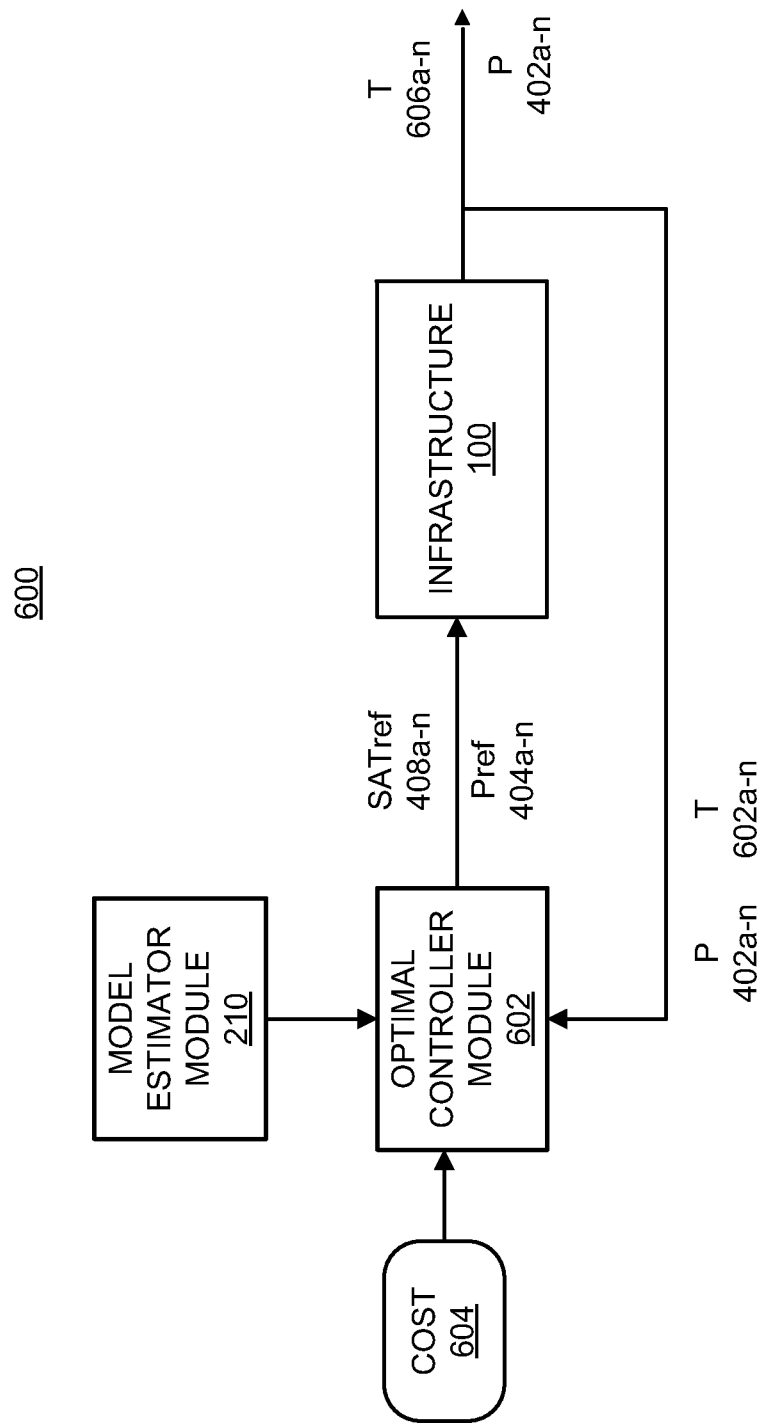
FIG. 6 depicts a control diagram of a controller, according to an example of the present disclosure.

Although the controller 130 is illustrated in FIG. 1 as comprising an element separate from the electronic components 116, the controller 130 may comprise or be integrated with an electronic component 116 without departing from a scope of the infrastructure 100 disclosed herein. In addition, or alternatively, the controller 130 may comprise computer readable machine instructions to operate on a computing device, for instance, one of the electronic components 116 or a separate computing device. Moreover, although a single controller 130 has been depicted in FIG. 1, a plurality of controllers 130 may be implemented to respectively control individual or groups of FMDs 114a-114m and, in further examples, AVTs 118. In addition, the plurality of controllers 130 may be arranged to operate in a hierarchical manner, such that, a higher level controller 130 sets up the inputs to a lower level controller 130, for instance, reference values (as shown in FIG. 4 and FIG. 6), that are to be tracked by the lower level controller 130.

Figure 2:
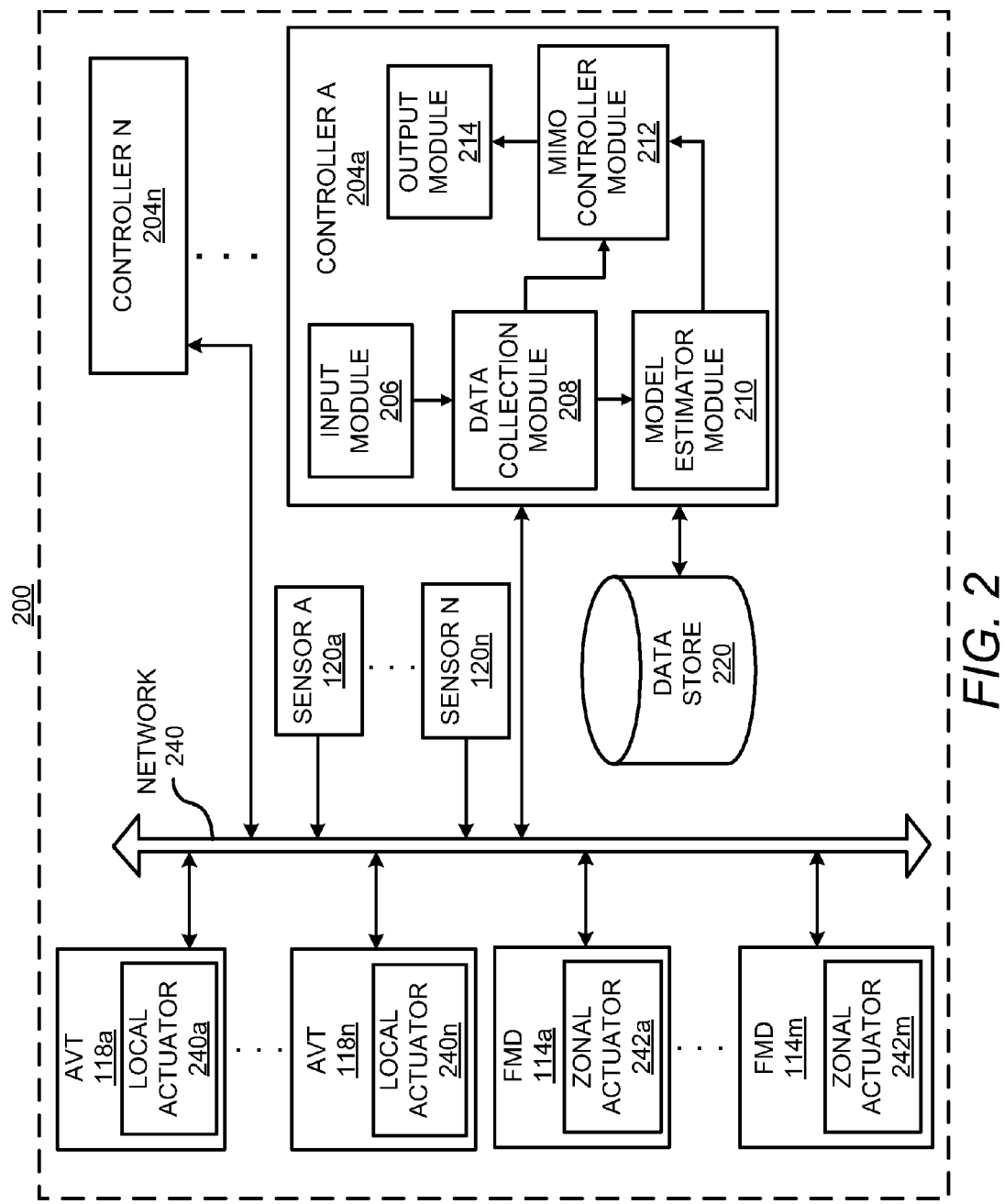
FIG. 2 shows a block diagram of a system for controlling a fluid moving device in an infrastructure, according to an example of the present disclosure.

Turning now to FIG. 2, there is shown a block diagram of a system 200 for controlling a fluid moving device in an infrastructure, such as the infrastructure 100 depicted in FIG. 1, according to an example. It should be understood that the system 200 may include additional components and that some of the components described herein may be removed and/or modified without departing from a scope of the system 200. For instance, the system 200 may include any number of sensors, memories, processors, FMDs 114a-114m, AVTs 118, etc., as well as other components, which may be implemented in the operations of the system 200.

As shown, the system 200 includes a controller 204a, which may be equivalent to the controller 130 depicted in FIG. 1. In one example, the system 200 includes a single controller 204a. In another example, the system 200 includes a plurality of controllers 204a-204n and each of the controllers 204b-204n may operate in similar manners to the controller 204a. As such, except as otherwise noted below, the description of the controller 204a, which is depicted as including an input module 206, a data collection module 208, a model estimator module 210, a Multi-Input Multi-Output (MIMO) controller module 212, and an output module 214, is intended to be identical for each of the controllers 204b-204n.

According to an example, the controller 204a comprises machine readable instructions stored, for instance, in a volatile or non-volatile memory, such as DRAM, EEPROM, MRAM, flash memory, floppy disk, a CD-ROM, a DVD-ROM, or other optical or magnetic media, and the like. In this example, the modules 206-214 comprise modules with machine readable instructions stored in the memory, which are executable by a processor of a computing device. According to another example, the controller 204a comprises a hardware device, such as, a circuit or multiple circuits arranged on a board. In this example, the modules 206-214 comprise circuit components or individual circuits, which the controller 204a may also control. According to a further example, the controllers 204a-204n comprise a combination of modules with machine readable instructions and hardware modules. In addition, multiple processors may be employed to implement or execute the controller 204a.

Generally speaking, as described hereinbelow with respect to FIG. 3 and the method 300, the controller 204a automatically identifies correlations between operational settings of the FMD 114a and environmental conditions at a location proximate to or within a plenum to which the controller 204a has control. The plenum may include the plenum 112 discussed above, or plenums that may be found in an infrastructure, such as, an office building or a home. Thus, for instance, the controller 204a may control the FMDs 114a-114m to thus manipulate conditions under the control of the controller 204a. For example, the controller 204a controls the FMDs 114a-114m that are in relatively close locations of the plenum 112 with respect to each other. As another example, the controller 204a controls the FMDs 114a-114m that are grouped together based upon factors other than proximities with respect to each other. For instance, the controller 204a may control a plurality of FMDs 114a-114m whose variations in volume flow rate of fluid affect the same electronic components 116, even though the plurality of FMDs 114a-114m are located in relatively close proximity with respect to each other.

According to another example, as described hereinbelow with respect to FIG. 4 and the method 400, the controller 204a may automatically identify correlations between operational settings of the AVTs 118 to which the controller 204a has control, the operational settings of the FMDs 114a-114m to which the controller 204a has control, and environmental conditions at heat dissipating devices contained in the infrastructure 100 and/or locations of the plenum 112. The heat dissipating devices may include the electronic devices 116 discussed above, or other heat dissipating devices that may be found in an infrastructure, such as, an office building or a home. In addition, the controller 204a determines operational settings of the FMDs 114a-114m and operational settings for the AVTs 118 under control of the controller 204a based upon the identified correlations. The controller 204a also implements an error-feedback loop between environmental conditions detected at locations proximate to or within the one or more heat dissipating devices and reference environmental conditions in determining operational settings of the FMDs 114a-114m and the operational settings for the AVTs 118 under control of the controller 204a.

In performing the functions in either of the examples discussed above, the controller 204a receives the condition information detected by the sensors 120a-120n over a network 240 that operates to couple the various components of the system 200. The network 240 generally represents a wired or wireless structure in the infrastructure for the transmission of data between the various components of the system 200. In addition, the controller 204a stores the condition information received from the sensors 120a-120n in one or more data stores 220, which may comprise any reasonably suitable memory upon which the controller 204a may store data and from which the controller 204a may retrieve data. Although the data store 220 has been depicted as forming a separate component from the controller 204a, it should be understood that the data store 220 may be integrated with the controller 204a without departing from a scope of the system 200. In addition, each of the controllers 204a-204n may include a respective data store 220 or one or more of the controllers 204a-204n may share one or more data stores 220.

The controller 204a may also output the determined operational settings of the FMDs 114a-114m and, in some instances, the AVTs 118, such as but not limited to volume flow rate set point(s), instructions pertaining to the determined volume flow rate set point(s), determined supply temperature set point(s), instructions pertaining to the determined supply temperature set point(s), determined operational settings and/or instructions pertaining to the determined operational settings through the output module 214. Thus, for instance, the determined volume flow rate set points, determined supply temperature set points, and the determined operational settings may be outputted to a display upon which the outputted information may be displayed, a printer upon which the outputted information may be printed, a network connection over which the outputted information may be conveyed to another computing device, a data storage device upon which the outputted information may be stored, etc. According to another example, the controller 204a communicates instruction signals over the network 240 to one or more of the FMDs 114a-114m and the AVTs 118. In this example, the zonal actuators 242 of the FMDs 114a-114m may vary the volume flow rates and supply temperatures of the FMDs 114a-114m to reach the determined set points as instructed by the controller 204a. According to another example, the local actuators 240 of the AVTs 118 may vary the operational settings of their respective AVTs 118 to cause the AVTs 118 to have the operational settings as instructed by the controller 204a. In this example, as described with respect to method 400 in FIG. 4, the control of the local actuators 240 of the AVTs 118 and the zonal actuators 242 of the FMDs 114a-114m is integrated to provide cooling capacity on demand to the electronic components 116 while substantially minimizing the energy consumption of the cooling infrastructure.

Figure 3:
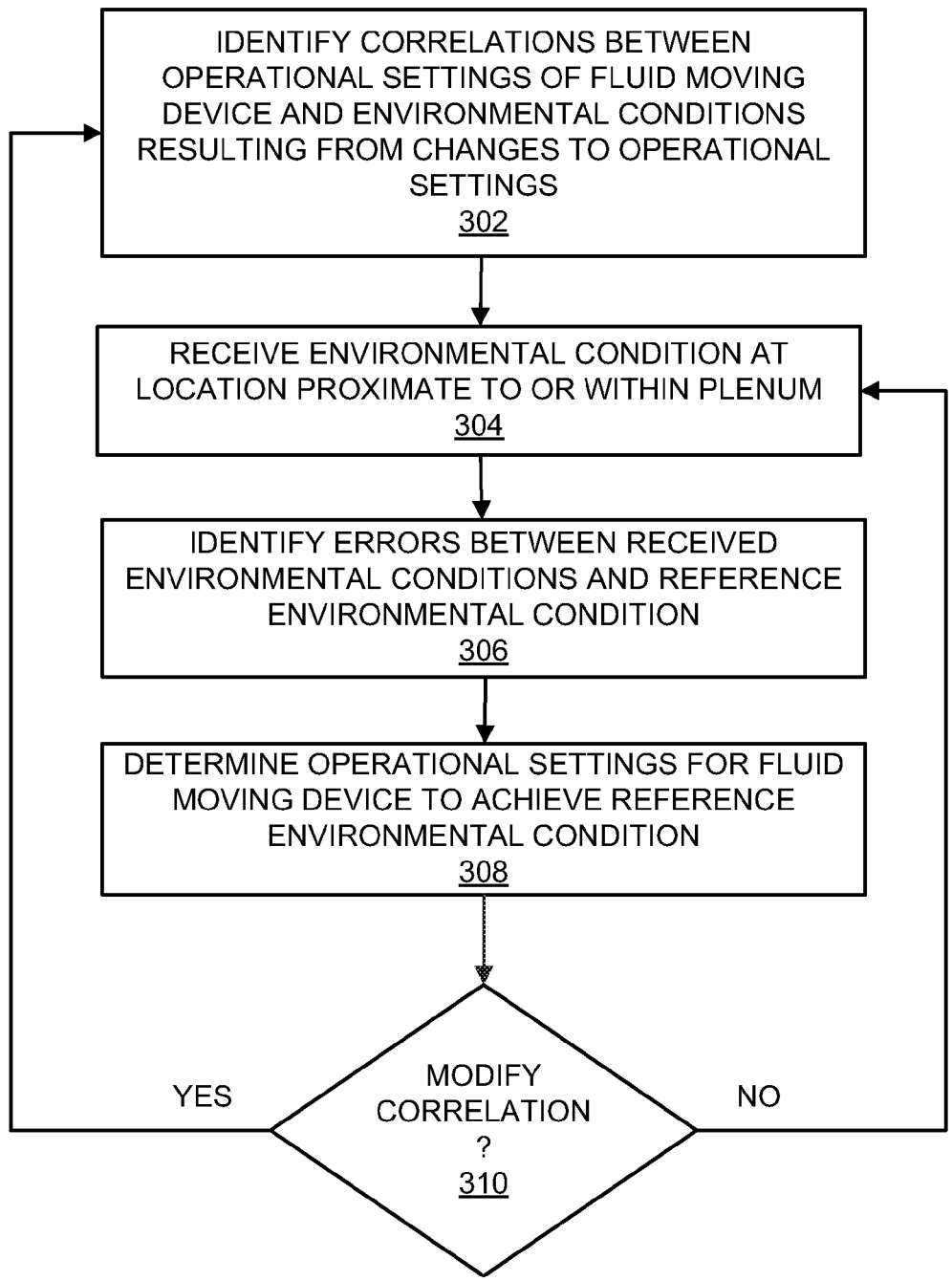
FIG. 3 depicts a flow diagram of a method for manipulating environmental conditions in an infrastructure containing a fluid moving device, according to an example of the present disclosure.
Figure 5:
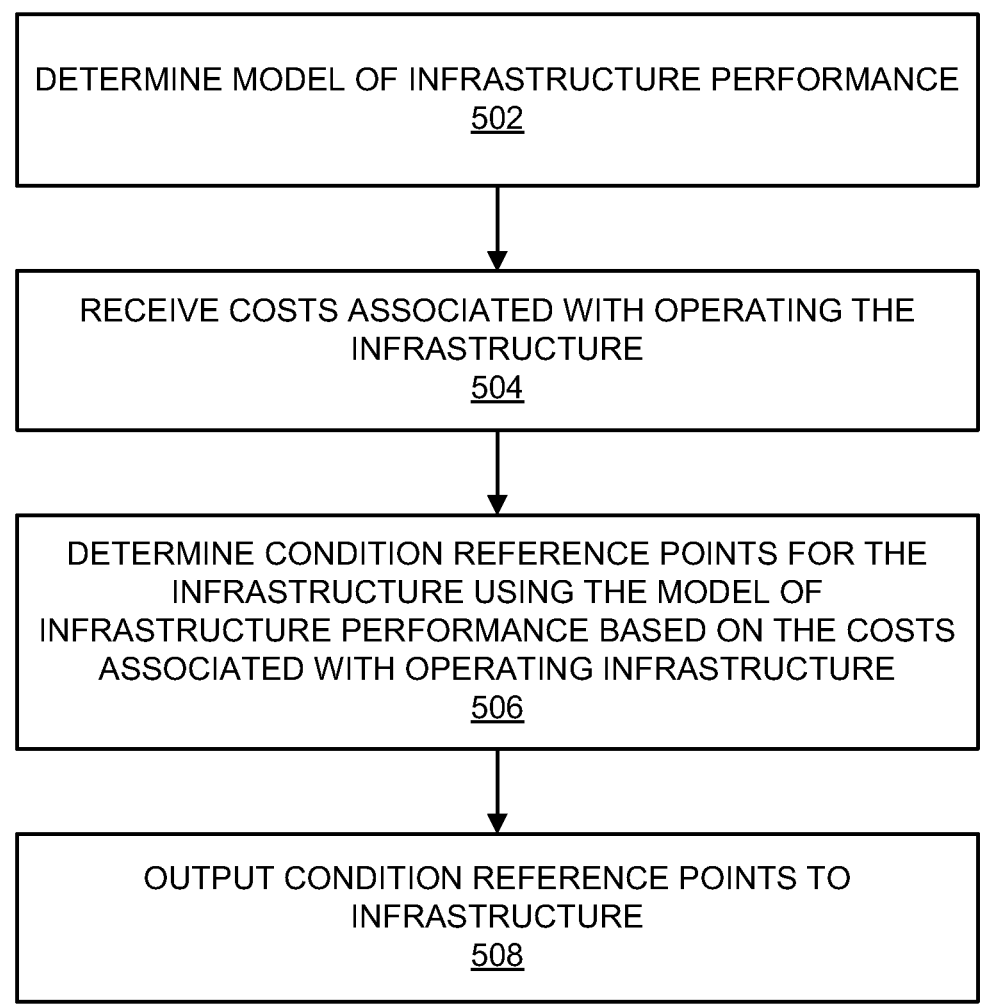
FIG. 5 depicts a flow diagram of a method for manipulating environmental conditions in an infrastructure containing a fluid moving device and an adaptive vent tile, according to another example of the present disclosure.

Various manners in which the modules 206-214 of the controller 204a may operate are discussed with respect to the methods 300 and 400 depicted in FIGS. 3 and 4 and the feedback control diagrams 500 and 600 depicted in FIGS. 5 and 6. It should be readily apparent that the methods 300 and 400 and the feedback control diagrams 500 and 600 respectively depicted in FIGS. 3-6 represent generalized illustrations and that other elements may be added or existing elements may be removed, modified or rearranged without departing from the scopes of the methods 300 and 400 and feedback control diagrams 500 and 600.

With reference first to FIG. 3, there is shown a flow diagram of a method 300 for manipulating environmental conditions in an infrastructure containing a FMD 114a, according to an example. Although particular reference is made to the controller 204a depicted in FIG. 2 as performing the processes outlined in the method 300, it should be understood that the method 300 may be performed by a different controller without departing from a scope of the method 300. In addition, it should be understood that the processes performed by the controller 204a are applicable to the other controllers 204a-204n with respect to the FMDs 114a-114m over which they have control.

At block 302, correlations between the operational settings of the FMD 114a and environmental conditions resulting from changes to the operational settings are identified, for instance, by the model estimator module 210. More particularly, for instance, the correlations are identified to enable determination of the effects that changing the operational settings of the FMD 114a are likely to have on the environmental conditions detected by the sensors 120a-120n. By way of particular example in which the detected environmental conditions comprise pressure, the correlation identified at block 302 enables determination of pressure changes at or in the plenum 112 in response to changes in the volume flow rate of fluid supplied by the FMD 114a.

According to an example, the model estimator module 210 may collect operational settings of the FMD 114a and environmental condition measurements detected by the sensors 120a-120n over a period of time and may identify the correlation between the operational settings of the FMD 114a and the environmental condition measurements from the collected data. In a second example, the model estimator module 210 may implement a computational fluid dynamics program to determine the correlation between the operational settings of the FMD 114a and the environmental condition measurements. In either example, the model estimator module 210 employs the collected data in generating a model that describes the correlations between the operational settings of the FMD 114a and the environmental conditions resulting from the operational settings.

In any respect, at block 302, the correlations may be determined through implementation of an off-line or online modeling operation. By way of example, the on-line modeling operation may involve randomly changing the operational settings of the FMD 114a, for instance the volume flow rate set point as described hereinbelow with respect to FIG. 4 and the control diagram 400, from interval to interval and measuring the pressure at each interval and using a linear regression technique (and associated algorithm) to identify the relationship between the operational settings of the FMD 114a and the detected pressures. As an example of the online modeling operation, the model may be identified through use of recursive techniques (and associated algorithms). Thus, for instance, the offline modeling operation develops a model based upon the configuration at the point in time in which the model is developed, whereas, the online modeling operation updates the model at sampled or controlled intervals. In instances where the offline modeling is sufficient, the online modeling may be unnecessary. In addition, the online modeling may be performed without the offline modeling having been performed first.

In addition, the correlations identified at block 302 may identify one or both of quantitative and qualitative correlations between the operational settings of the FMD 114a and the environmental conditions detected at the location proximate to or within the plenum 112 to which the correlation is identified. In instances in which there are a plurality of FMDs 114a-114m, the qualitative correlations may define which of the FMDs 114a-114m affect which areas of the infrastructure 100 and the quantitative correlations may define the levels to which changes in the volume flow rate of the fluid supplied by the FMDs 114a-114m affect the location proximate to or within the plenum 112 to which the correlation is identified.

At block 304, the environmental conditions detected by the sensors 120a-120n are received, for instance, through the input module 206. The environmental conditions may be detected by the sensors after fluid is supplied into the plenum 112 by the FMD 114a. In addition, the data collection module 208 may store the received environmental conditions in the data store 220.

At block 306, an identification of errors between the received environmental conditions and reference environmental conditions is made. The reference environmental conditions may comprise those conditions that have been identified as being the minimum (or maximum) allowable conditions at locations proximate to or within the plenum 112. Thus, for example, the reference environmental conditions may comprise the maximum desired or allowable pressures in the plenum 112 for the FMDs 114a-114m. As such, the error between the detected pressures and the reference pressure may be used to identify the operational settings of the FMD 114a that result in efficient supply of cooling resources to the heat dissipating devices, such as, substantially minimized cooling resource use.

At block 308, the operational settings of the FMD 114a to achieve the reference environmental condition is determined, for instance, by the MIMO controller module 212. Generally speaking, the MIMO controller module 212 may receive multiple inputs from multiple sensors 120a-120n and may output instructions for multiple outputs, comprising multiple FMDs 114a-114m. Various types of controllers may be implemented in determining the operational settings for the FMDs 114a-114m, without departing from a scope of the disclosure. According to an example, a Proportional, Integral, Derivative (PID) controller is implemented to compute the operational settings for the FMD 114a. The gain parameters of the PID controllers can be configured and/or modified based on the model parameters identified online and/or offline.

In instances in which there are multiple FMDs 114a-114m in the infrastructure, controlled by multiple controllers 204a-204n, the controllers 204a-204n may be employed to control respective groups of FMDs 114a-114m, with each group including one or more FMDs 114a-114m, for instance, to tune the temperature distributions in respective thermal zones. In another example, the controller 204a-204n may be implemented with zonal controllers that may coordinate the operations of multiple ones of the controllers 204a-204n.

With reference to FIG. 4, there is shown a control diagram 400, according to an example. As shown therein, the MIMO controller module 212 receives as inputs, information from the model estimator module 210 and the sensors 120a-120n. Although the control diagram 400 may be used to illustrate the method 300 described with respect to FIG. 3 hereinabove, the control diagram 400 is not limited to the method 300 and may be used with other methods and processes.

As shown in FIG. 4, the model estimator module 210 generates a model, either offline or online, as either a steady-state or a dynamic model of the correlation between the FMDs 114a-114m and the environment conditions (such as but not limited to, pressures (Ps) 402a-402n), detected within the infrastructure, as discussed above. In addition, the MIMO controller module 212 receives the model from the model estimator 210 as well as determines error information. The error information includes a difference between actual condition(s), P 402a-402n in this instance, and a reference value for the condition (pressure reference values (Pref) 404a-404n). Moreover, the MIMO controller module 212 determines how the volume flow rate set points (VFRSPs) 406a-406m of the FMDs 114a-114m are to be manipulated to meet the Prefs 404a-404n at a system under control 410, for instance the infrastructure 100. Further, the MIMO controller module 212 may also determine how supply air temperature set points of the FMDs 114a-114m are to be manipulated by evaluating the error information using the model. Alternately, the supply air temperature set points of the FMDs 114a-114m may be determined independently of the MIMO controller module 212, for instance received from a source (not shown) external to the controller 204a.

Generally speaking, the MIMO controller module 212 determines which of the actuators 242a-242m of the FMDs 114a-114m should be operated to vary the volume flow rates to achieve the Prefs 404a-404n for the sensors 120a-120n in any of the manners discussed above. Thus, for instance, the VFRSPs 406a-406m may comprise those set points that are determined to result in the Prefs 404a-404n. In addition, the model estimator 210 may update the model of the correlation between the operational settings of the FMDs 114a-114m and the detected environmental conditions in the system under control 410 as conditions change in the infrastructure 100, which may occur as the operational settings of the FMDs 114a-114m change. More particularly, the operational settings of the actuators 242 of the FMDs 114a-114m may include supply temperature references (SATrefs) 408a-408n or set points and the VFRSPs 406a-406m. The actuators 242 tune the supply temperature and the volume flow rate of the fluid supplied into the plenum 112 to conform the SATrefs 408a-408n and the VFRSPs 406a-406m.

Each of the controllers 204a-204n may be employed to control respective groups of FMDs 114a-114m, with each group including one or more FMDs 114a-114m, for instance, to tune the pressure distribution in respective pressure zones. In another example, the controller 204a-204n may be implemented with zonal controllers that may coordinate the operations of multiple ones of the controllers 204a-204n.

With reference back to FIG. 3, at block 310, the model estimator module 210 may determine whether a previously identified correlation requires modification. For instance, the model estimator module 210 may determine that the previously identified correlation is no longer valid, if, for instance, conditions at locations within the plenum 112 do not change as expected following manipulation of the operational settings of the FMDs 114a-114m. In this instance, the correlations between the operational settings of the FMDs 114a-114m and the detected environmental conditions may be updated again, and blocks 304-310 may be repeated. Otherwise, the model estimator module 210 and the MIMO controller module 212 may continue to receive the environmental conditions detected by the sensors 120a-120n at block 304, and blocks 306-310 may be repeated. Thus, for instance, at block 302, the model estimator module 210 may update a model that was generated offline based upon information collected online.

With reference now to FIG. 5, there is shown a flow diagram of a method 500 for providing condition reference points for an infrastructure, according to an example. It should be readily apparent that the method discussed below with respect to FIG. 5 represents a generalized illustration and that other processes may be added or existing processes may be removed, modified or rearranged without departing from the scope of the method 500.

The method 500 makes particular reference to an optimal controller module 602, described hereinbelow with respect to FIG. 6. The optimal controller module 602 may be used in a controller (not shown) that is separate from the controllers 204a-204n to provide condition reference points for the controllers 204a-204n. Alternately, optimal controller module 602 may be utilized in a controller such as the controller 204a.

At block 502, a model of infrastructure performance is determined, for instance, by the model estimator module 210 of the controller 204a. The model of infrastructure performance may comprise, for instance, a static or dynamic model of the infrastructure's performance. The model of infrastructure performance may be based upon a performance metric, such as but not limited to electricity costs, service level agreements (SLAs), carbon credits, etc. According to an example, the model of infrastructure performance correlates conditions detected by the sensors 120a-120n, for instance intake temperatures of the racks 102a-102n as described with respect to FIG. 1, and controlled variables used in the infrastructure 100, for instance the SATrefs 408a-408n and the VFRSPs 406a-406m.

At block 504, costs associated with the operation of the infrastructure are received, for instance, by the optimal controller module 602. These costs may include electricity and other costs associated with operating the infrastructure 100, such as but not limited to water costs.

At block 506, the optimal controller module 602 determines condition reference points, for instance, the SATrefs 408a-408n and the Prefs 404a-404n through minimization of the costs based on the model of infrastructure performance. The optimal controller module 602 may substantially minimize the overall energy consumption of the infrastructure 100, or more generally, the costs associated with operating the infrastructure 100, while maintaining constraints on thermal metrics associated with the operation of the infrastructure. The SATrefs 408a-408n and the Prefs 404a-404n are outputted to the infrastructure 100 at block 508.

With reference to FIG. 6, there is shown a control diagram 600, according to an example. As shown therein, the optimal controller module 602 receives as inputs, information from the model estimator module 210 and the costs associated with operating the infrastructure 100. Although the control diagram 600 may be used to illustrate the method 500 described with respect to FIG. 5 hereinabove, the control diagram 600 is not limited to the method 500 and may be used with other methods and processes.

As shown in FIG. 6, the model estimator module 210 generates a model, either offline or online, and as either a steady-state or a dynamic model, that may be used to substantially minimize the costs associated with operation of the infrastructure 100. The optimal controller module 602 receives the model from the model estimator 210 as well as cost information 604. Additionally, the optimal controller module 602 receives Ps 402a-402n, and temperatures (T) 606a-606n from the infrastructure 100. The optimal controller module 602 evaluates the cost information using the model to determine the Prefs 404a-404n and the SATrefs 408a-408n for the infrastructure 100 that substantially minimizes cost based on the models.

Figure 7:
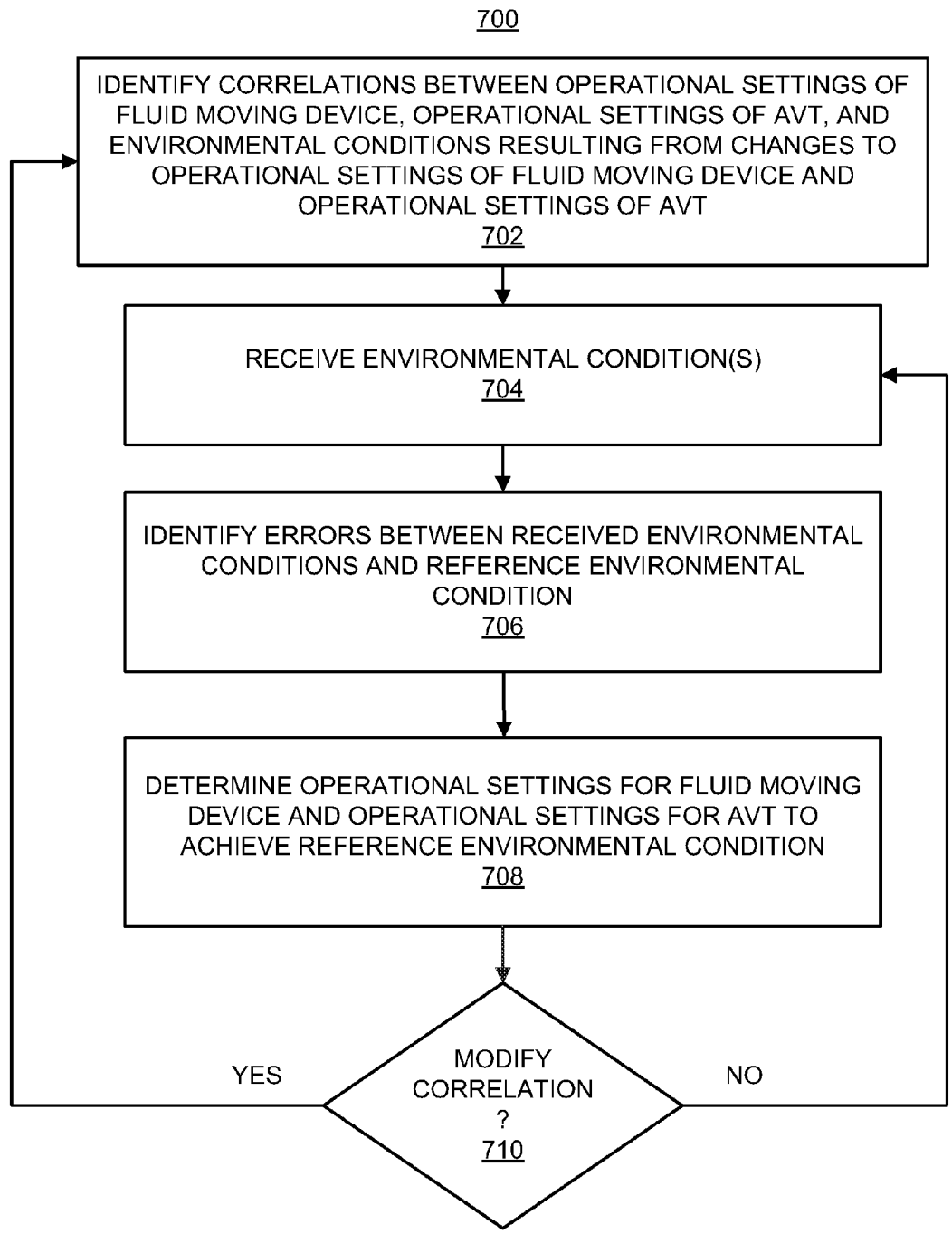
FIG. 7 depicts a flow diagram of a method for manipulating environmental conditions in an infrastructure containing cooling devices, according to an example of the present disclosure.

With reference now to FIG. 7, there is shown a flow diagram of a method 700 for manipulating environmental conditions in an infrastructure containing one or more FMDs 114a-114m and a plurality of AVTs 118, according to an example. It should be readily apparent that the method discussed below with respect to FIG. 7 represents a generalized illustration and that other processes may be added or existing processes may be removed, modified or rearranged without departing from the scope of the method 700.

Although particular reference is made to the controller 204a depicted in FIG. 2 as performing the processes outlined in the method 700, it should be understood that the method 700 may be performed by a different controller without departing from a scope of the method 700. In addition, it should be understood that the processes performed by the controller 204a are applicable to the other controllers 204a-204n with respect to the FMDs 114a-114m and the AVTs 118 over which they have control.

At block 702, correlations between the operational settings of the FMD 114a, operational settings of AVT 118s, and environmental conditions at various locations in a system under control 410, for instance in the infrastructure 100, are identified, for instance, by the model estimator module 210. The environmental conditions may include environmental conditions detected at a location proximate to or within the plenum 112 and environmental conditions at one or more heat dissipating devices, such as, the electronic devices 116. More particularly, for instance, the correlations are identified to enable determination of the effects that changing the operational settings of the FMD 114a and the operational settings of AVTs 118 are likely to have on the environmental conditions detected by the sensors 120a-120n. By way of particular example in which the detected environmental conditions comprise pressure and temperature, the correlation identified at block 702 enables determination of pressure changes at or in the plenum 112 and temperature changes at the heat dissipating devices in response to changes in the operational settings of the FMD 114a and the operational settings of the AVTs 118.

According to an example, the model estimator module 210 may collect information pertaining to the operational settings of the FMD 114a, operational settings of the AVTs 118, and environmental condition measurements detected by the sensors 120a-120n for the system under control 410 over a period of time and identifies the correlation between the operational settings of the FMD 114a, the operational settings of the AVTs 118, and the environmental condition measurements from the collected data. In a second example, the model estimator module 210 may implement a computational fluid dynamics program to determine the correlation between the operational settings of the FMD 114a, the operational settings of the AVTs 118, and the environmental condition measurements. In either example, the model estimator module 210 employs the collected data in generating a model that describes the correlations between the operational settings of the FMD 114a, the operational settings of the AVTs 118, and the environmental conditions resulting from the operational settings.

It should be understood that the correlations between the operational settings of the FMD 114a, the operational settings of the AVTs 118, and the detected environmental conditions may be identified through implementation of any suitable process, as discussed above.

At block 704, the environment conditions detected by the sensors 120a-120n are received, for instance, through the input module 206. The environment conditions may be detected following supply of fluid into the plenum by the FMD 114a. In addition, the data collection module 208 may store the received environmental conditions in the data store 220.

At block 706, an identification of errors between the received environmental conditions and reference environmental conditions is made. The reference environmental conditions may comprise those conditions that have been identified as being the minimum (or maximum) allowable conditions at locations to which the correlation is identified. Thus, for example, the reference environmental conditions may comprise the minimum desired or allowable temperatures for the heat dissipating devices and maximum desired of allowable pressure in the plenum 112.

At block 708, the operational settings of the FMD 114a is determined, for instance, by the MIMO controller module 212. Additionally, the MIMO controller module 212 may determine the operational settings of the AVT 118. Generally speaking, the MIMO controller module 212 may receive multiple inputs from multiple sensors 120a-120n and may output instructions for multiple outputs, comprising multiple FMDs 114a-114m and multiple AVTs 118. Various types of controllers may be implemented in determining the operational settings for the FMDs 114a-114m, and the AVTs 118 without departing from a scope of the disclosure.

According to a particular example, the MIMO controller module 212 substantially minimizes the overall operation cost subject to the constraints on the temperatures, the operational settings of the AVTs 118 and the operational settings of the FMD 114a by configuring the FMDs 114a-114m, and the AVTs 118 directly.

In instances in which there are multiple FMDs 114a-114m and AVTs 118 in the infrastructure, controlled by multiple controllers 204a-204n, the controllers 204a-204n may be employed to control respective groups of FMDs 114a-114m and AVTs 118, with each group including one or more FMDs 114a-114m and/or AVTs 118, for instance, to tune the temperature distributions in respective thermal zones. In another example, the controller 204a-204n may be implemented with zonal controllers that may coordinate the operations of multiple ones of the controllers 204a-204n.

At block 710, the model estimator module 210 may determine whether a previously identified correlation requires modification. For instance, the model estimator module 210 may determine that the previously identified correlation is no longer valid, if, for instance, conditions at locations within the infrastructure 100 do not change as expected following manipulation of the operational settings of the FMDs 114a-114m and the operational settings of the AVTs 118. In this instance, the correlations between the operational settings of the FMDs 114a-114m, the operational settings of the AVTs 118 and the detected environmental conditions may be updated again, and blocks 704-710 may be repeated. Otherwise, the model estimator module 210 and the MIMO controller module 212 may continue to receive the environmental conditions detected by the sensors 120a-120n at block 704, and blocks 706-710 may be repeated. Thus, for instance, at block 702, the model estimator module 210 may update a model that was generated offline based upon information collected online.

Figure 8:
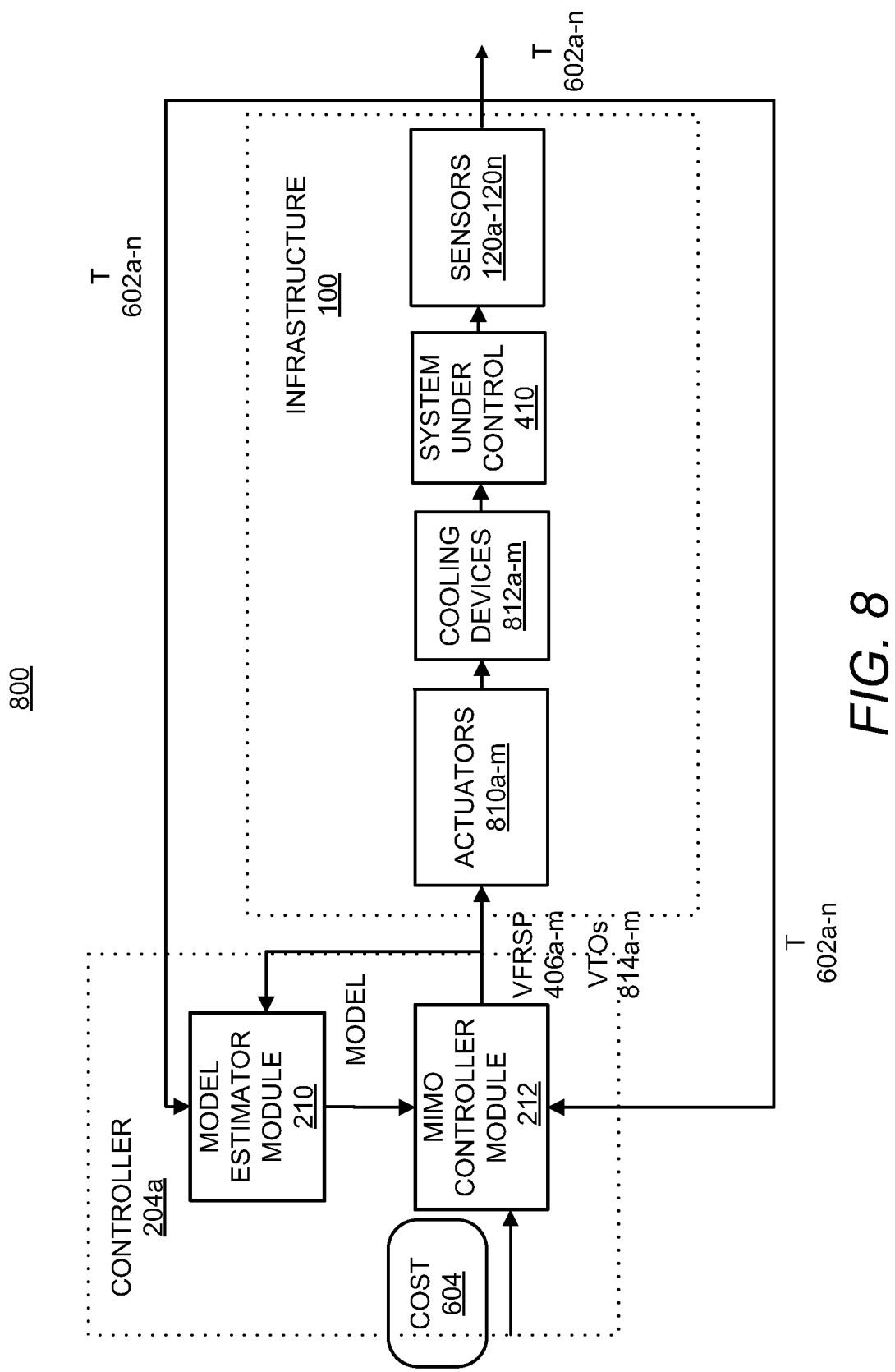
FIG. 8 depicts a control diagram of a controller, according to another example of the present disclosure.

With reference now to FIG. 8, there is shown a control diagram 800, according to an example. As shown therein, the MIMO controller module 212 receives as inputs, information from the model estimator module 210 and the sensors 120a-120n. Although the control diagram 800 may be used to illustrate the method 700 described with respect to FIG. 7 hereinabove, the control diagram 800 is not limited to the method 700 and may be used with other methods and processes.

As shown in FIG. 8, similarly as described with respect to FIG. 4, the model estimator module 210 generates a model, either offline or online, and as either a steady-state or a dynamic model, of the correlation between cooling devices 812a-m (for instance the FMDs 114a-114m, the AVTs 118) and the environment conditions (such as but not limited to, pressure and temperature) detected within the infrastructure, as discussed above. The MIMO controller module 212 receives cost information 604 from an external source. In addition, the MIMO controller module 212 receives the model from the model estimator 210 as well as determines error information. The error information includes a gap between actual conditions, such as but not limited to, the Ts 606a-606n, and reference values for the conditions, for instance, the Prefs 404a-404n and the SATrefs 408a-408n. Moreover, the MIMO controller module 212 evaluates the error information using the model to determine how the actuators 810a-m of the cooling devices 812a-m are to be controlled, for instance the VFRSPs 406a-406m of the FMDs 114a-114m and the vent tile openings (VTOs) 814a-814m of the AVTs 118 are to be manipulated. Further, the MIMO controller module 212 may also determine how supply air temperature set points of the FMDs 114a-114m are to be manipulated by evaluating the error information using the model.

The actuators 242a-242m of the FMDs 114a-114m and the actuators 240a-240n of the AVTs 118 are coordinated in a similar manner as described hereinabove with respect to FIG. 4. In this instance however, the model estimator module 210 determines correlations between the operational settings of the FMDs 114a-114m, the operational settings of the AVTs 118 and the detected environmental conditions.

Some or all of the operations set forth in the methods 300, 500 and 700 may be contained as a utility, program, or subprogram, in any desired computer accessible medium. In addition, the methods 300, 500 and 700 may be embodied by computer programs, which can exist in a variety of forms both active and inactive. For example, they may exist as machine readable instructions, including source code, object code, executable code or other formats. Any of the above may be embodied on a computer readable storage medium.

Example computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 9:
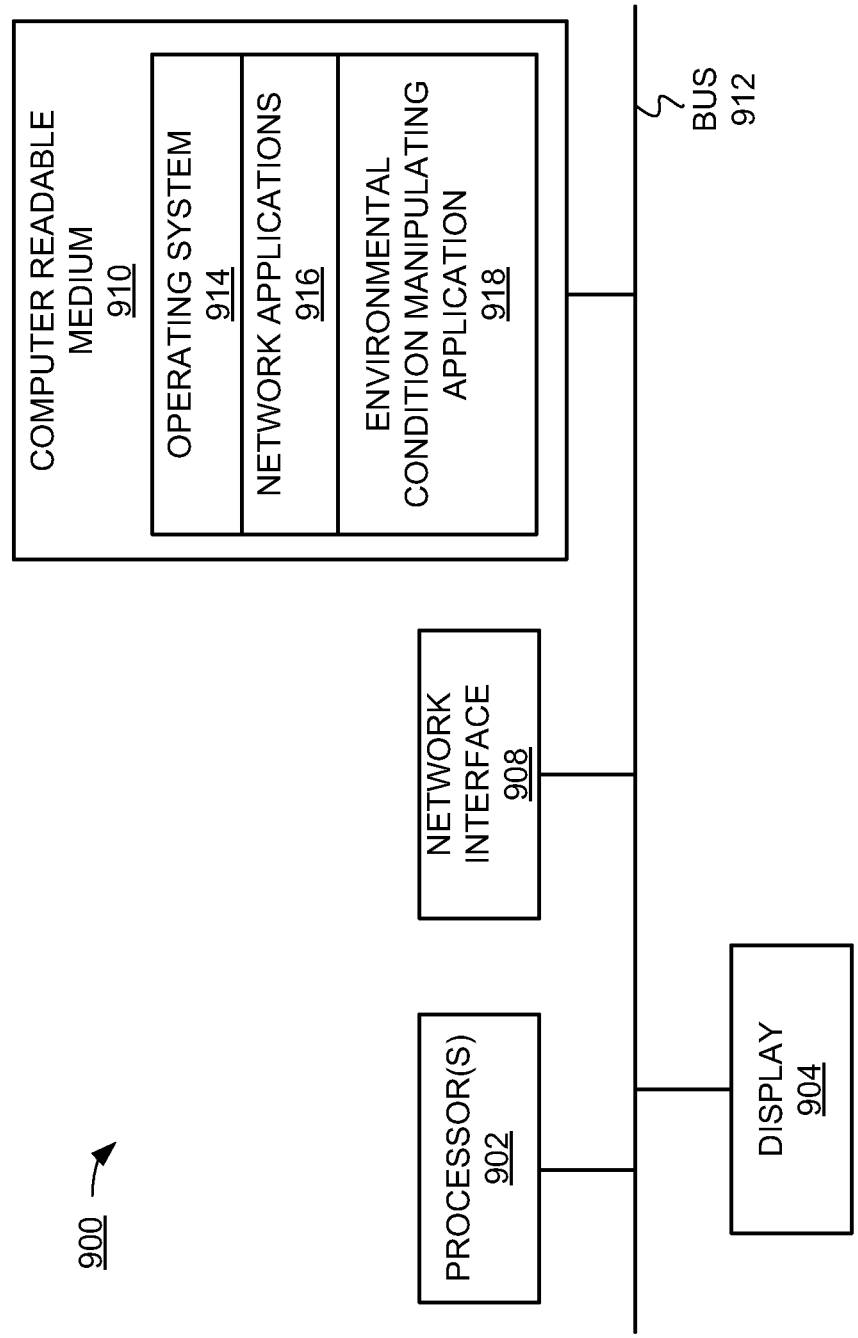
FIG. 9 illustrates a computer system, which may be employed to perform various functions described herein, according to an example of the present disclosure.

Turning now to FIG. 9, there is shown a schematic representation of a computing device 900 configured in accordance with examples of the present disclosure. The device 900 includes a processor 902, such as a central processing unit; a display device 904, such as a monitor; a network interface 908, such as a Local Area Network LAN, a wireless 802.11x LAN, a 3G mobile WAN or a WiMax WAN; and a computer-readable medium 910. Each of these components is operatively coupled to a bus 912. For example, the bus 512 may be an EISA, a PCI, a USB, a FireWire, a NuBus, or a PDS.

The computer readable medium 910 may be any suitable non-transitory medium that participates in providing instructions to the processor 902 for execution. For example, the computer readable medium 910 may be non-volatile media, such as an optical or a magnetic disk; volatile media, such as memory; and transmission media, such as coaxial cables, copper wire, and fiber optics. The computer readable medium 910 may also store other machine readable instructions, including word processors, browsers, email, Instant Messaging, media players, and telephony machine-readable instructions.

The computer-readable medium 910 may also store an operating system 914, such as Mac OS, MS Windows, Unix, or Linux; network applications 916; and an environmental condition manipulating application 918. The operating system 914 may be multi-user, multiprocessing, multitasking, multithreading, real-time and the like. The operating system 914 may also perform basic tasks such as recognizing input from input devices, such as a keyboard or a keypad; sending output to the display 904; keeping track of files and directories on the computer readable medium 910; controlling peripheral devices, such as disk drives, printers, image capture device; and managing traffic on the bus 912. The network applications 916 include various components for establishing and maintaining network connections, such as machine readable instructions for implementing communication protocols including TCP/IP, HTTP, Ethernet, USB, and FireWire.

The environmental condition manipulating application 918 provides various components for manipulating environmental conditions in an infrastructure, as described above. In certain examples, some or all of the processes performed by the application 918 may be integrated into the operating system 914. In certain examples, the processes may be at least partially implemented in digital electronic circuitry, or in computer hardware, machine readable instructions (including firmware and/or software), or in any combination thereof.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is a preferred example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. A method for manipulating environmental conditions in an infrastructure containing a fluid moving device having a first actuator for varying a volume flow rate of fluid supplied into a plenum and a second actuator for varying a supply temperature of the fluid supplied into the plenum, said method comprising:
in a computing device, identifying correlations between operational settings of the fluid moving device and environmental condition values resulting from changes to the operational settings;
receiving an environmental condition measurement detected at a location proximate to or within the plenum following supply of the fluid into the plenum by the fluid moving device;
identifying errors between the received environmental condition measurement and a reference environmental condition value;
determining operational settings for the fluid moving device to achieve the reference environmental condition value based upon the identified correlations and errors, wherein the operational settings for the fluid moving device include a volume flow rate set point and a supply temperature set point of the fluid supplied by the fluid moving device; and
controlling one or both of the first actuator and the second actuator to vary one or both of the volume flow rate to attain the determined volume flow rate set point and the supply temperature to attain the determined supply temperature set point.

2. The method according to claim 1, wherein identifying the correlations further comprises modeling the correlations.

3. The method according to claim 2, wherein modeling the correlations further comprises implementing a computational fluid dynamics tool to model the correlations.

4. The method according to claim 2, wherein modeling the correlations further comprises modeling the correlations through one of an offline operation using historical information and an online operation using at least one of detected environmental condition information, a computational fluids dynamics tool, and recursive techniques.

5. The method according to claim 1, further comprising:
determining a model of infrastructure performance;
receiving a cost associated with operating the infrastructure; and
determining the reference environmental condition value using the model of infrastructure performance based on the cost associated with operating the infrastructure.

6. The method according to claim 1, further comprising:
determining whether the identified correlations between the operational settings of the fluid moving device and the environmental condition values resulting from changes to the operational settings require modification; and
modifying the identified correlations in response to a determination that the identified correlations require modification.

7. The method according to claim 1, wherein determining the operational settings for the fluid moving device to achieve the reference environmental condition value further comprises determining an operational setting for the fluid moving device that substantially minimizes cooling resource use in the infrastructure while meeting predefined environmental condition value thresholds.

8. The method according to claim 1, wherein the infrastructure further contains an adaptive vent tile and wherein identifying correlations between the operational settings of the fluid moving device and the environmental condition values resulting from changes to the operational settings comprises identifying correlations between the operational settings of the fluid moving device, operational settings of the adaptive vent tile, and environmental condition values resulting from changes to the operational settings of the fluid moving device and the operational settings of the adaptive vent tile;
wherein receiving the environmental condition measurement detected at the location proximate to or within the plenum further comprises receiving an environmental condition measurement detected at a location proximate to or within the heat dissipating device; and
wherein identifying errors between the received environmental condition measurement detected at the location proximate to or within the plenum and the reference environmental condition value comprises identifying errors between the received environmental condition measurement detected at the location proximate to or within the heat dissipating device, the received environmental condition measurement detected at the location proximate to or within the plenum, the reference environmental condition value at the heat dissipating device and the reference environmental condition measurement detected at the location proximate to or within the plenum, and wherein determining operational settings for the fluid moving device to achieve the reference environmental condition value comprises determining at least one of the operational settings for the fluid moving device, and the operational settings for the adaptive vent tile based upon the identified correlations and errors.

9. The method according to claim 8, wherein determining at least one of the operational settings for the fluid moving device and the operational settings for the adaptive vent tile further comprises determining at least one of the operational settings for the fluid moving device and the operational settings of the adaptive vent tile that substantially minimizes cooling resource use in the infrastructure while meeting predefined environmental condition value thresholds.

10. A controller for manipulating environmental conditions in an infrastructure containing a fluid moving device having a first actuator to vary a volume flow rate of fluid supplied into a plenum and a second actuator to vary a supply temperature of the fluid supplied into the plenum, said controller comprising:

a module to access a model that identifies correlations between operational settings of the fluid moving device and environmental condition values resulting from changes to the operational setting, to receive an environmental condition measurement detected at a location proximate to or within the plenum following supply of the fluid into the plenum by the fluid moving device, to identify errors between the received environmental condition measurement and a reference environmental condition value, to determine operational settings for the fluid moving device to achieve the reference environmental condition value based upon the identified correlations and errors, wherein the operational settings for the fluid moving device include a volume flow rate set point and a supply temperature set point of the fluid supplied by the fluid moving device, and to control one or both of the first actuator and the second actuator to vary one or both of the volume flow rate to attain the determined volume flow rate set point and the supply temperature to attain the determined supply temperature set point; and a processor to implement the module.

11. The controller according to claim 10, wherein the module is further to generate the model.

12. The controller according to claim 11 wherein the module is further to generate the model at least one of online using recursive techniques and offline using historical information.

13. The controller according to claim 11, wherein the module is further to generate the model using detected environmental condition information.

14. The controller according to claim 11, wherein the module is further to generate the model through implementation of a computational fluid dynamics tool.

15. The controller according to claim 10, wherein the infrastructure contains an adaptive vent tile and wherein the module is further to access a model that identifies correlations between operational settings of the fluid moving device, an operational setting of the adaptive vent tile and environmental condition values resulting from changes to the operational settings and the operational settings of the adaptive vent tile, to receive a plurality of environmental condition measurements detected at locations proximate to or within a heat dissipating device, to identify errors between the received environmental condition measurement detected at the location proximate to or within the heat dissipating device, the received environmental condition measurement detected at the location proximate to or within the plenum, the reference environmental condition value at the heat dissipating device and the reference environmental condition measurement detected at the location proximate to or within the plenum, and to determine at least one of the operational settings of the fluid moving device, and the operational settings for the adaptive vent tile based upon the identified correlations and errors.

16. A non-transitory computer readable storage medium on which is embedded a computer program, said computer program implementing a method for manipulating environmental conditions in an infrastructure containing a fluid moving device having a first actuator to vary a volume flow rate of fluid supplied into a plenum and a second actuator to vary a supply temperature of the fluid supplied into the plenum, said computer program comprising computer readable code that when executed by a processor cause the processor to:

identify correlations between operational settings of the fluid moving device and environmental condition values resulting from changes to the operational settings;

receive an environmental condition measurement detected at a location proximate to or within the plenum following supply of fluid into the plenum by the fluid moving device;

identify errors between the received environmental condition measurement at the location proximate to or within the plenum and a reference environmental condition value;

determine operational settings for the fluid moving device to achieve the reference environmental condition value based upon the identified correlations and errors, wherein the operational settings for the fluid moving device include a volume flow rate set point and a supply temperature set point of the fluid supplied by the fluid moving device; and control one or both of the first actuator and the second actuator to vary one or both of the volume flow rate to attain the determined volume flow rate set point and the supply temperature to attain the determined supply temperature set point.

17. The computer readable storage medium according to claim 16, wherein the infrastructure further contains an adaptive vent tile and wherein to identify correlations between the operational settings of the fluid moving device and environmental condition values resulting from changes to the operational settings, the computer readable code is further to cause the processor to identify correlations between the operational settings of the fluid moving device, an operational setting of the adaptive vent tile, the reference environmental condition value at the plenum, and a reference environmental condition value at a heat dissipating device, said computer program further comprising computer readable code to cause the processor to:

receive an environmental condition detected at a location proximate to or within the heat dissipating device;

identify errors between the received environmental condition measurement detected at the location proximate to or within the heat dissipating device, the received environmental condition measurement detected at the location proximate to or within the plenum, the reference environmental condition value at the heat dissipating device and the reference environmental condition value at the location proximate to or within the plenum; and determine at least one of the operational settings of the fluid moving device, and the operational setting for the adaptive vent tile based upon the identified correlations and errors.

* * * * *